United States Patent [19]
Weimer

[11] 4,242,700
[45] Dec. 30, 1980

[54] LINE TRANSFER CCD IMAGERS

[75] Inventor: Paul K. Weimer, Princeton, N.J.

[73] Assignee: RCA Corporation, New York, N.Y.

[21] Appl. No.: 5,073

[22] Filed: Jan. 22, 1979

[51] Int. Cl.³ .................. H04N 9/07; H04N 3/15; H01L 29/78
[52] U.S. Cl. .................. 358/44; 358/213; 357/24
[58] Field of Search .............. 358/44, 48, 213, 43; 357/24; 250/211 J

[56] References Cited

U.S. PATENT DOCUMENTS

| | | | |
|---|---|---|---|
| 3,683,193 | 8/1972 | Weimer | 250/209 |
| 3,943,545 | 3/1976 | Kim | 357/24 |
| 4,001,861 | 1/1977 | Carnes | 357/24 |
| 4,031,315 | 6/1977 | Pfleiderer | 358/212 |

FOREIGN PATENT DOCUMENTS 2001504  1/1979  United Kingdom.

OTHER PUBLICATIONS

Bailey et al., "A Complimentary CCD/SAW Radar Signal Processor", *1978 CCD Conference*, San Diego, pp. 3B-41 to 3B-51.
Kovac et al., "Solid State Imaging Emerges from Charge Transport", *Electronics*, Feb. 28, 1972.
Sei et al., "A Meander Channel CCD Linear Image Sensor", IEEE Journal of Solid-State Circuits, vol. SC-13, No. 1, Feb. 1978, pp. 66-70.
Weimer, "Self-Scanned Image Sensors Based on Charge Transfer by Bucket Brigade Method", *IEEE Transactions on Electron Devices*, vol. ED-18, No. 11, Nov. 1971, pp. 996-1003.
Koike et al., "An NPN Structure 484x384 MOS Imager for a Single-Chip Color Camera", *IEEE International Solid-State Circuits Conference*, Feb. 15, 1979, pp. 192-193.

*Primary Examiner*—John C. Martin
*Attorney, Agent, or Firm*—Samuel Cohen; H. Christoffersen

[57] ABSTRACT

A CCD imager in which charges are read from the imager in serial fashion in the row direction a group of adjacent rows at a time. The charge packets of one row of a group are interleaved or read concurrently with those of other rows of the group during read out. Vertical interlacing is obtained by grouping the rows in different ways during the respective odd and even fields of an interlaced frame. Colors may be sensed by employing color filters in a particular pattern at the respective integration sites of the array.

32 Claims, 15 Drawing Figures

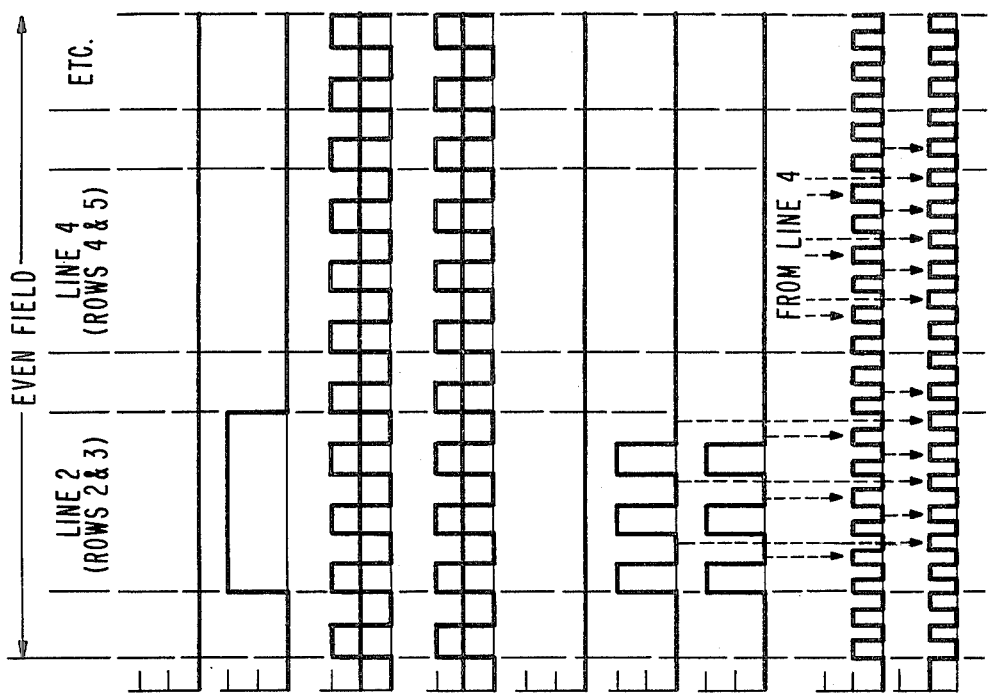
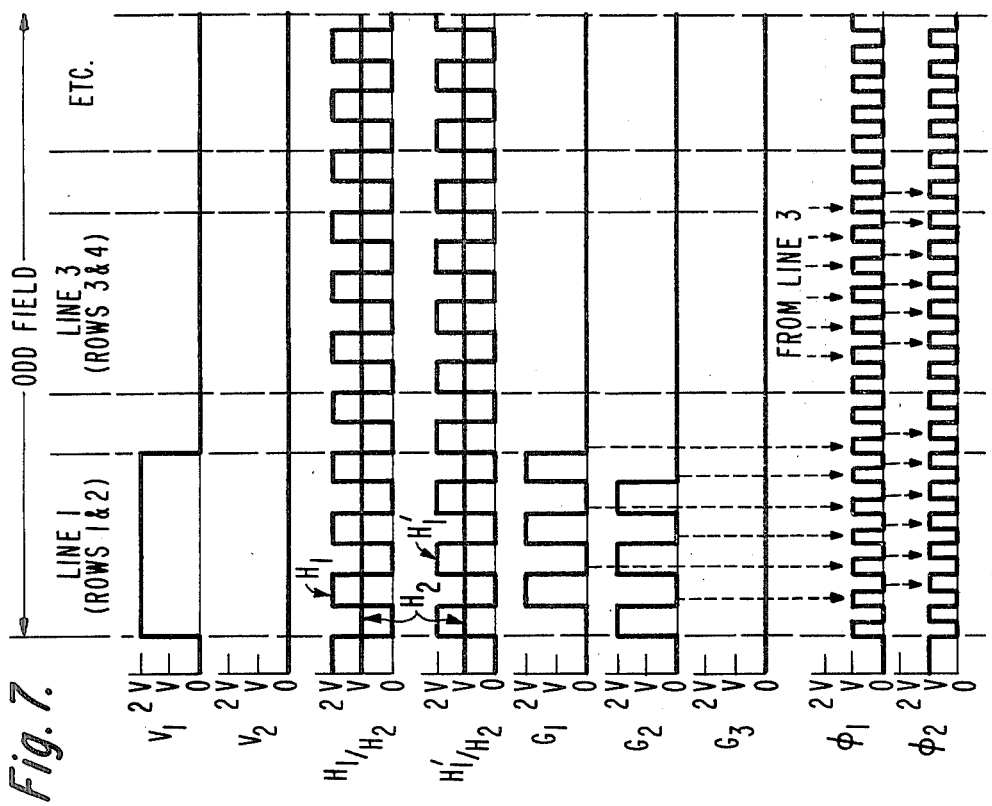
Fig. 7.

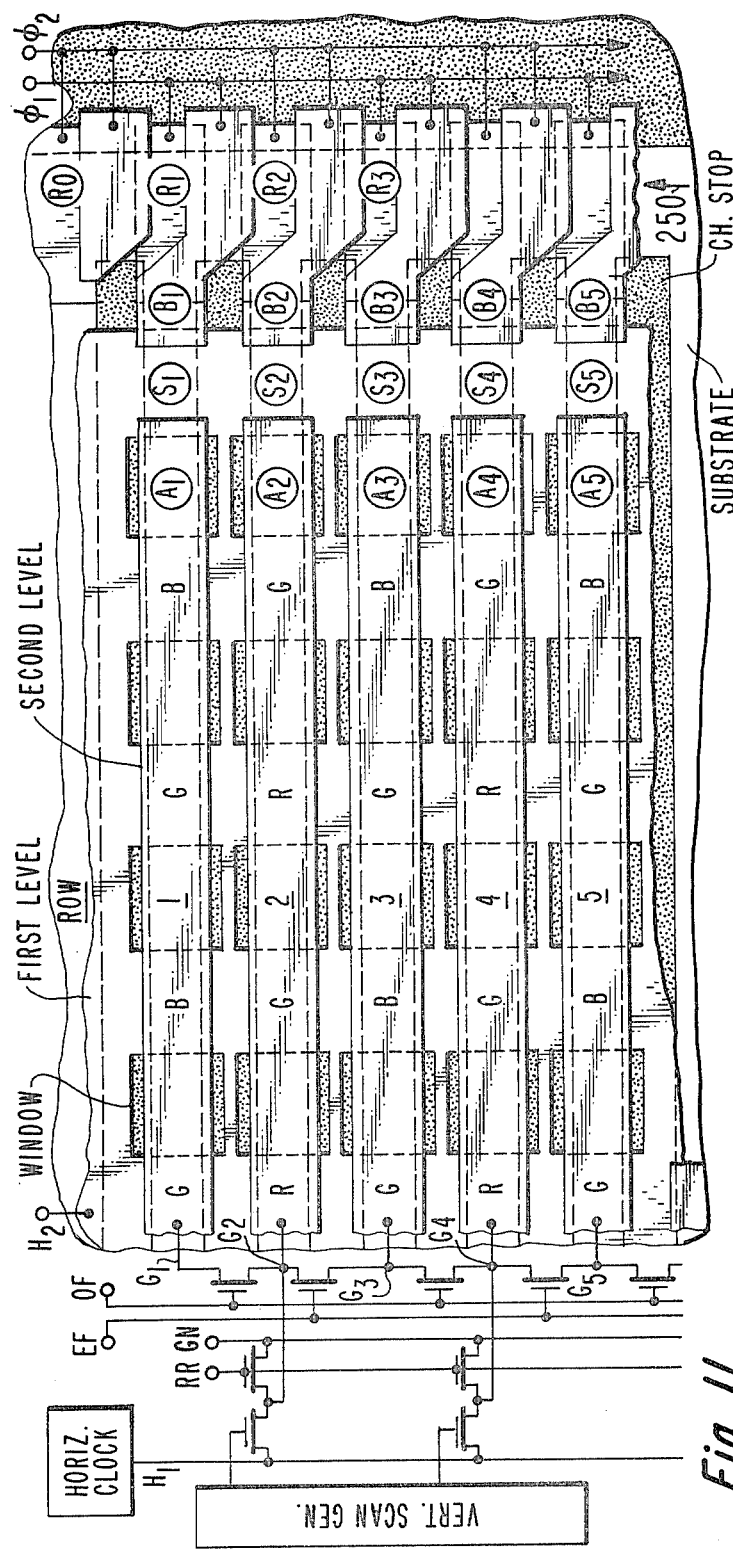
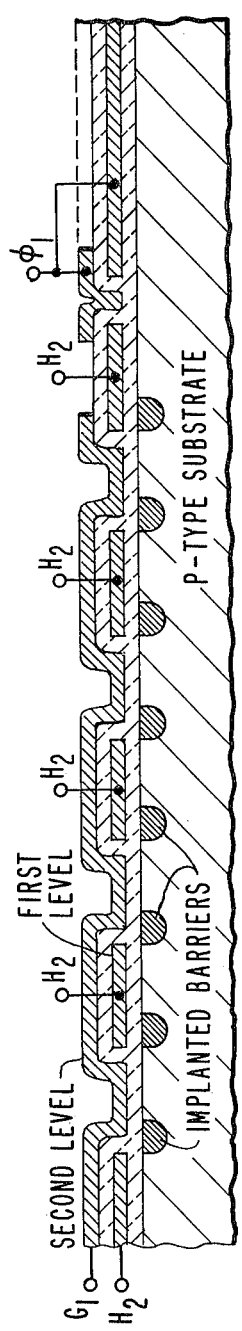
Fig. 11.
Fig. 12.

LINE TRANSFER CCD IMAGERS

This invention relates to charge coupled device (CCD) imagers of the "line transfer" type.

Horizontal line transfer imagers are known in the art and a number of different examples of such imagers are illustrated in U.S. Pat. No. 3,683,193 for "Bucket Brigade Scanning of Sensor Array," issued to the present inventor on Aug. 8, 1972. In imagers of this kind, the rows of the array are read sequentially, each row being read out in serial fashion prior to the readout of the succeeding row. In the case of an imager of the charge transfer type, such as one of the bucket brigade or CCD type, the charge packets read serially from a row are translated to video signals and these are displayed on the screen of a display such as a kinescope, in locations corresponding to those from which they originated in the imager.

The present invention is embodied in improved imagers of the general type discussed above. The structures of the imagers are new and the ways in which the imagers are read out are new. With respect to the latter, the imagers are read out a group of rows at a time, with the charge packets in one row interleaved or read concurrently with those of the other row(s) of the group. Vertical interlacing is achieved by employing differently grouped rows for one field than are employed for the other field. The imagers are suitable for color with a suitable array of color filters arranged in a particular pattern over the integration sites. In a preferred form of the invention, the color filter pattern is such that the color information in one field is arranged in the same pattern as it appears in the other field.

In the drawing:

FIG. 7 is a drawing of waveforms to help explain the operation of the system of FIG. 4;

FIG. 11 is a plan view of another form of imaging system embodying the invention;

FIG. 12 is a section through one of the rows of the system of FIG. 11;

Figure 1:
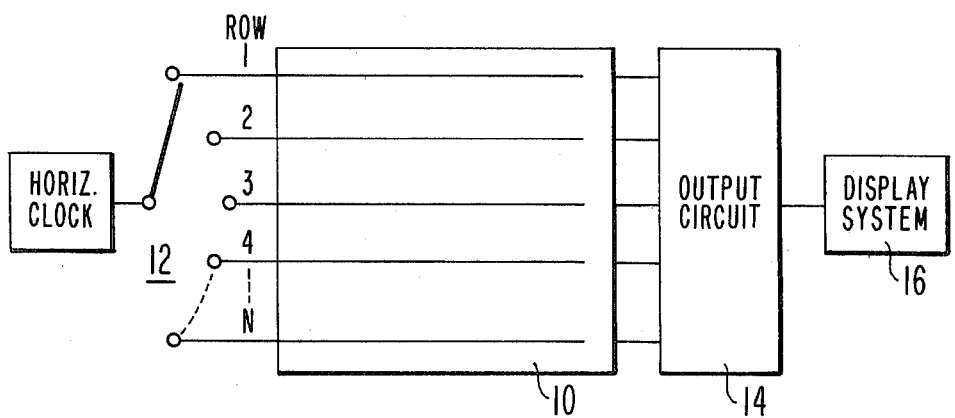
FIG. 1 is a block diagram of a known horizontal line transfer imager.

The known system of FIG. 1 includes horizontal transfer imager 10 having N rows. In operation, during the integration times, a light image projected onto the imager causes the accumulation of charges at the respective integration sites proportional to the intensity of the light reaching these sites. Upon the completion of the integration time, a charge pattern is present in the imager corresponding to the light pattern.

The charges stored in the imager are read out a row at a time. Electronic circuits, represented schematically by the switch 12, may be employed to read out the rows in sequence. For example, in the position of the switch 12 shown, charges from row 1 are sequentially transferred to an output circuit 14 which may include filters, amplifiers, registers and the like. The charges are propagated to the output circuit by applying clock voltages to row 1 of the imager as, for example, is illustrated in the above-identified Weimer patent. The video signals produced by the output circuit may be displayed on a display device such as a kinescope within display system 16. Upon completion of the readout of row 1, the switch 12 moves to row 2 and the process is repeated. The process continues until all N rows of the imager have been read out. These N rows correspond to the N lines of, for example, a television display.

Figure 2:
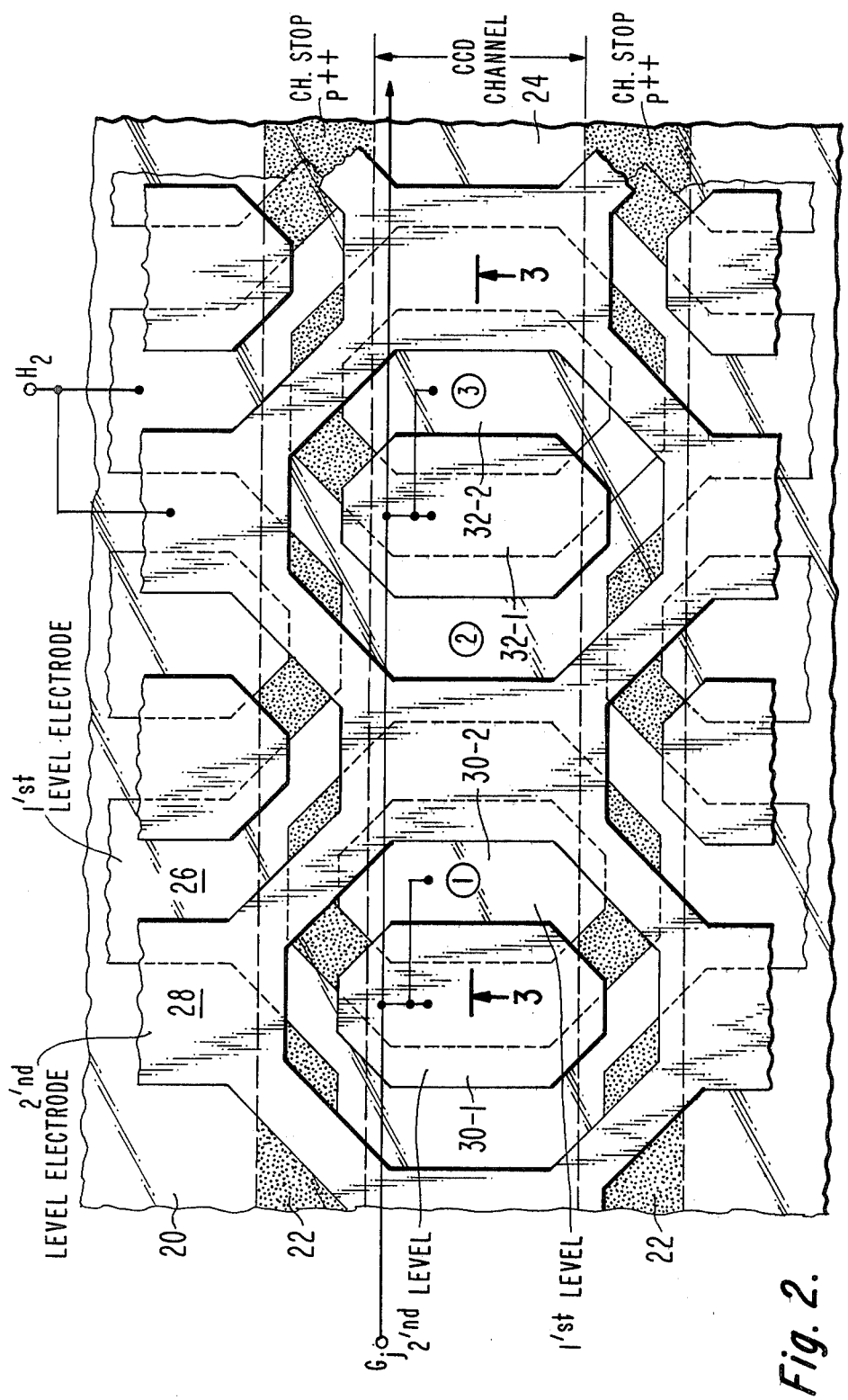
FIG. 2 is a plan view showing a portion of an imager embodying the invention.
Figure 3:
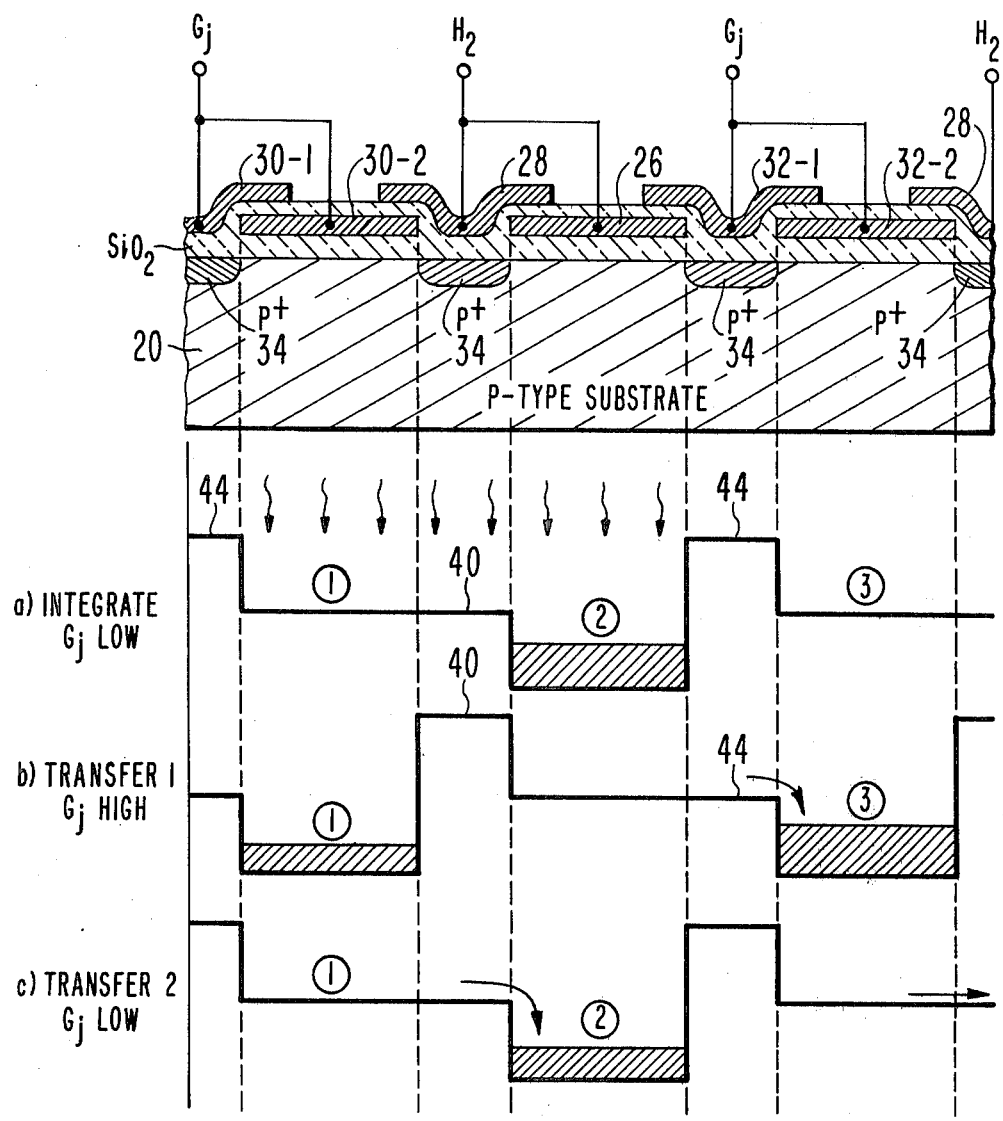
FIG. 3 is a section taken along lines 3—3 of FIG. 2 and includes also surface potential profiles to illustrate the operation of the imager.

An improved imager embodying the invention is illustrated in plan view in FIG. 2 and in cross-section in FIG. 3. It includes a P-type substrate 20 formed with P++ channel-stop diffusions 22 therein which operate as potential barriers and which define a plurality of CCD channels in the substrate. One such channel is shown at 24. The electrodes comprise two-level electrodes and preferably are formed of a material such as polysilicon. There are two common electrodes 26 and 28, electrode 26 being in a lower or "first" level and 28 in an upper or second level. These two electrodes are substantially identically shaped; however, one is laterally offset relative to the other. Each electrode comprises a lattice with octagonal cut-outs or apertures therein. Electrodes 26 and 28 are coupled to one another and are held at a DC level $H_2$.

The electrode structure also includes individual octagonal shaped electrodes. Each pair of such electrodes comprises a first level electrode such as 30-2 and a second level electrode such as 30-1. These two electrodes also are electrically connected and are driven by a voltage $G_j$.

The electrode structure just described is shown in cross-section in FIG. 3. Means must be provided for producing a deeper potential well beneath the first level electrodes than beneath the second level electrodes. There are a number of ways this may be achieved. The one illustrated in FIG. 3 is to employ P+ regions 34 beneath the second level electrodes 28. These regions, which may be ion implanted regions, are doped somewhat more heavily than the P-type substrate but are doped less heavily than the P++ channel stops 22. They produce a relatively shallow potential barrier beneath the second level electrodes 28. This electrode structure produces beneath each pair of electrodes driven by a common voltage, an asymmetrical potential well as is desired to obtain unidirectional charge propagation. Alternative means for producing asymmetrical potential wells which may be employed in the present invention, include employing a direct voltage offset between the two electrodes of each pair and/or placing the first level electrode closer to the substrate than the second level electrode, and there are also other alternatives.

Several modes of operation are possible. In the one illustrated in FIG. 3, during the integration time the voltage $G_j$ is low (preferably at ground) and $H_2$ is high (at level V which may be +5 volts or so) so that a potential well 2 is present beneath the storage electrode 26 and the potential "wells" 1 and 3 are at the same level as (as illustrated) or at a slightly higher level than the barrier 40 beneath electrode 28. (Potential wells are identified by circled letters in FIG. 3 and in other of the figures.) Operated in this way, during the integration time any charge carriers excited by radiation such as light (represented by the arrows) striking the substrate in the vicinity of a storage electrode such as 26, are captured in the relatively deep well beneath that storage electrode.

During the integration time, charge carriers in amounts proportional to the light intensities reaching the substrate at the respective integration sites become stored in the potential wells as illustrated at a in FIG. 3. As is well understood in the art, the light projected onto the substrate for exciting such charge carriers may be applied either through the polysilicon electrodes or, alternatively, through the back surface of the substrate. In the latter mode of operation, it is desirable to thin the substrate to improve the sensitivity of the imager, especially in the shorter (blue) wavelength region.

The stored charge carriers may now be propagated by continuing to maintain $H_2$ at the same DC level while alternating the value of $G_j$ between levels higher than and lower than $H_2$. FIG. 3b illustrates the propagation of charge one half stage to the right, achieved by making $G_j$ more positive. This reduces the height of potential barrier 44 and at the same time makes potential well 3 deeper. A value of $G_j$ can be chosen such that all of the charge (electrons) stored in potential well 2 transfer to potential well 3. During the following time interval, the voltage $G_j$ is made low as illustrated at c in FIG. 3 and the charge propagates an additional half stage to the right. This process continues until the entire row of charges has been read out of the array.

Figure 4:
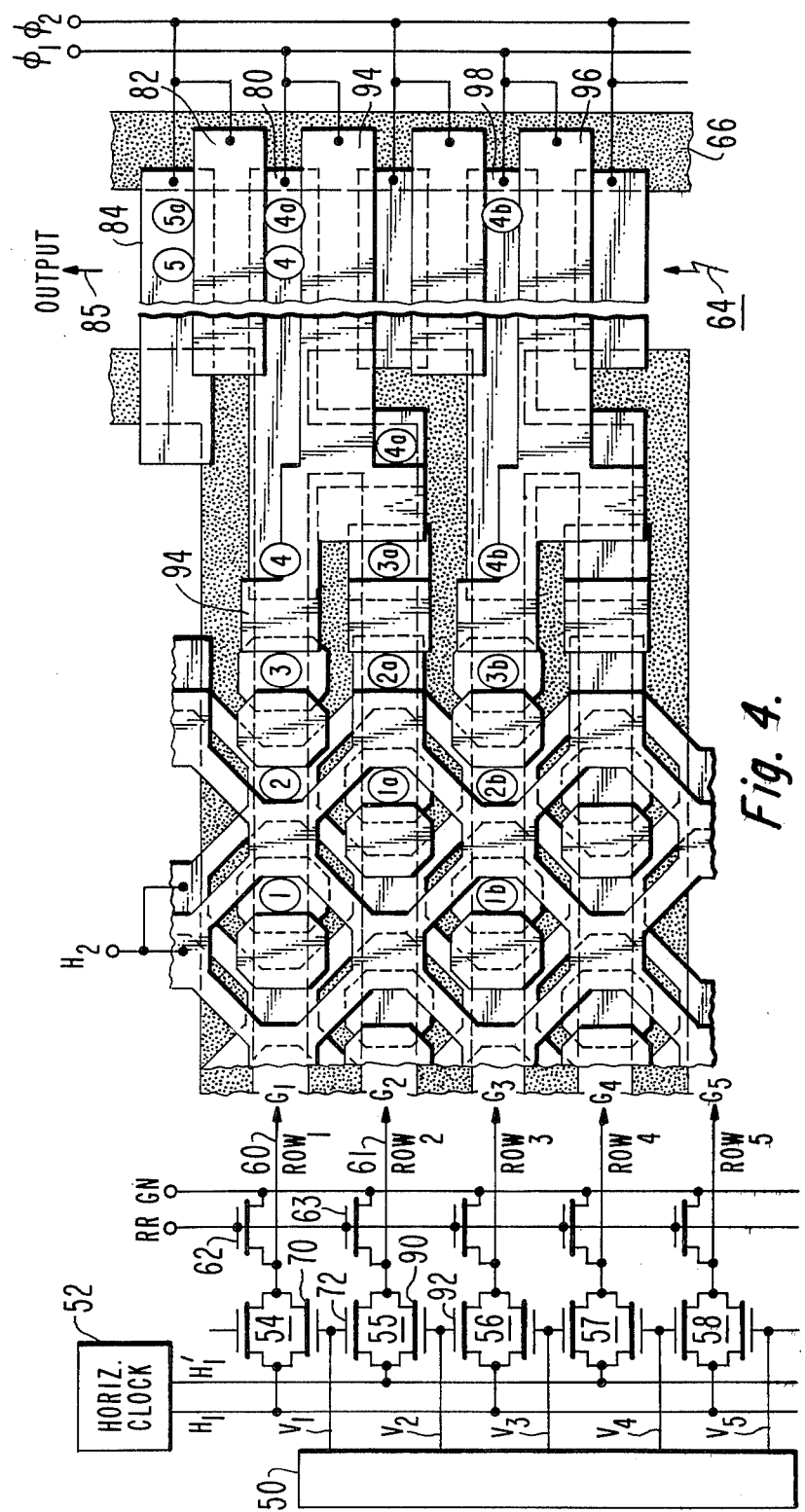
FIG. 4 is a plan view of a portion of an imaging system embodying the invention.

FIG. 4 illustrates schematically a portion of a system embodying the electrode structure shown in FIGS. 2 and 3. The system includes vertical scan generator 50 which produces the vertical scanning voltages $V_1$, $V_2$ . . . $V_N$. One voltage goes high at a time and the voltages go high and low in sequence. That is, when $V_1$ goes relatively positive, $V_2-V_N$ remain relatively less positive. Assuming standard vertically interlaced operation, the vertical clock (generator) is operated in such a manner that during the odd field $V_1$ remains positive during line 1, $V_2$ goes positive only during the following retrace period and $V_3$ remains positive during line 3, etc. That is, during the scanning periods of the odd field, $V_1$, $V_3$, $V_5$ and so on, go high and then low in that sequence and during the scanning periods of the even field $V_2$, $V_4$, $V_6$ and so on, go high and then low in a similar sequence.

The horizontal clock generator 52 generates square waves of substantially higher frequency than the vertical clock voltages V. A sufficient number of H pulses must occur during the time one of the V signals is high concurrently to read out a pair of rows. As will be shown, for one field, say the odd field, $H_1$ and $H'_1$ are complementary voltage waveforms. In other words, for the odd field, $H_1 = \overline{H}'_1$. For the even field, $H_1$ is in phase with $H'_1$, that is, $H_1 = H'_1$.

Figure 5:
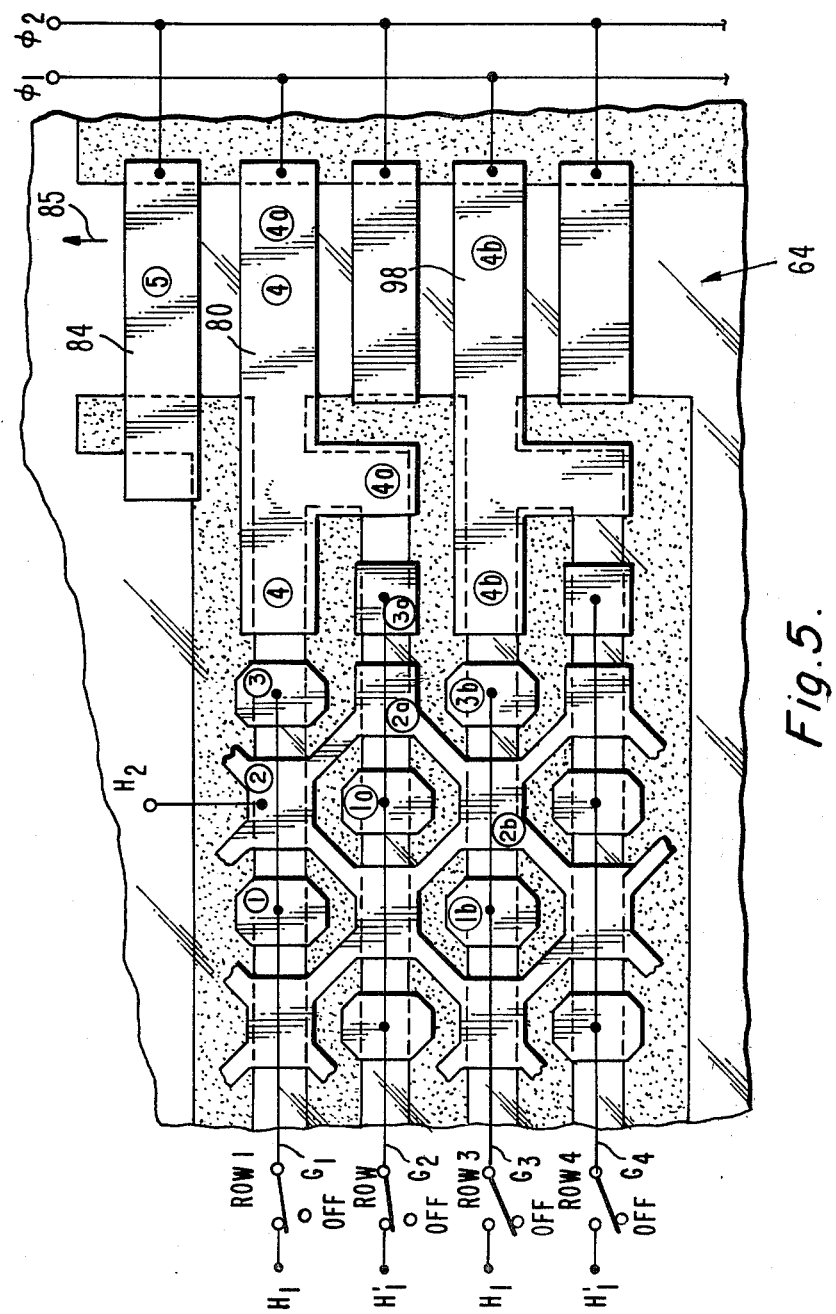
FIG. 5 is a plan view of the first or lower level electrodes of a portion of the system of FIG. 4.
Figure 6:
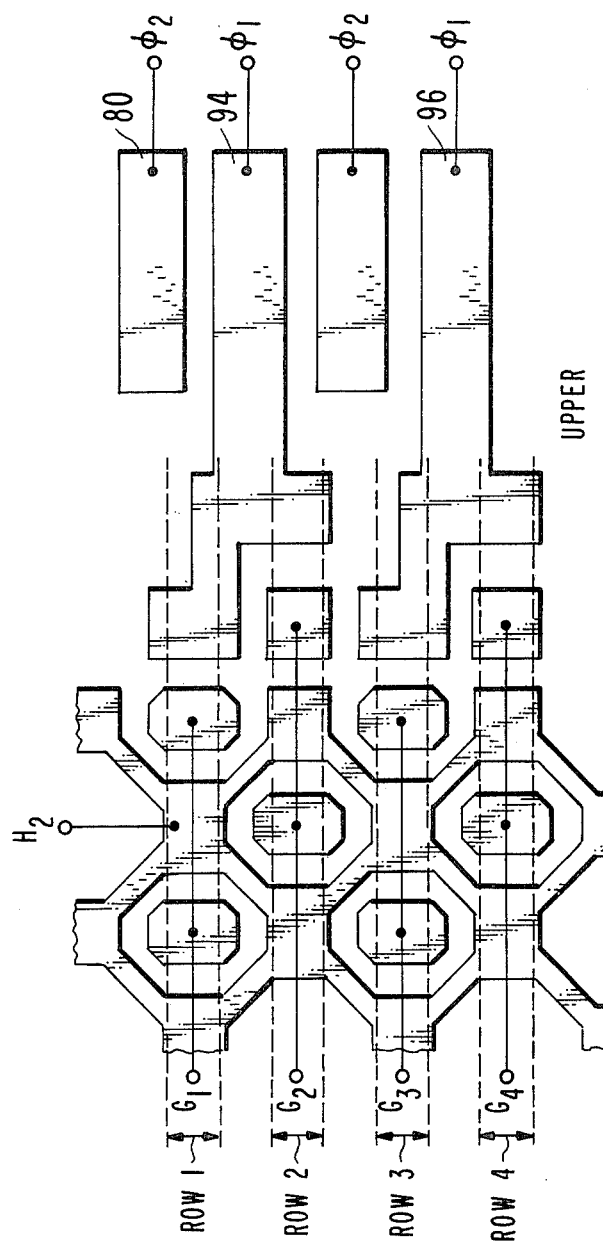
FIG. 6 is a plan view of the upper or second level electrodes of a portion of the imager of FIG. 4.

The horizontal clock pulses are applied to pairs of transmission gates, the $H_1$ pulses being applied to alternate pairs 54, 56, 58 and so on and the clock pulses $H'_1$ being applied to alternate pairs of gates 55, 57 and so on. The output of each pair of transmission gates is applied to the octagonally shaped electrodes in a different row. For example, the output $G_1$ is applied to the electrodes of row 1, the output $G_2$ to the electrodes of row 2 and so on. To simplify the drawing, the connections are not shown in FIG. 4; however, they are shown in FIGS. 5 and 6. In view of the complexity of the electrode structure and their overlapping nature, FIG. 5 is included to show only the lower level electrodes and FIG. 6 to show only the upper level electrodes.

Returning to FIG. 4, each row conductor is connected to the drain electrode of a different field effect transistor. For example, row conductor 60 is connected to the drain electrode of transistor 62 and row conductor 61 to the drain electrode of transistor 63. These "reset" transistors may be N channel transistors of the enhancement type. The source electrode in these transistors is connected to a common source of voltage GN and the gate electrode of these transistors is connected to a common source of reset voltage RR.

The respective rows of the array lead to a CCD register 64 which is shown, in part, in FIG. 4. One edge of the register is defined by a channel stop 66 and the other edge of the register is defined by a plurality of channel stop regions formed with spaces between these regions to permit charges propagated along the respective rows to pass into the CCD register 64.

The operation of the system of FIG. 4 may be understood by referring to FIGS. 3–7. To start with, it may be assumed that all of the vertical clock voltages V are low. Here and in the discussion which follows, low is to be understood as a relatively low positive voltage level. In FIG. 7, low is represented as zero and high as 2 V. The common pair of gate electrodes 26, 28 (FIG. 3) is maintained at an intermediate level $H_2 = V$, and as explained in reference to FIG. 3, photoelectrons are therefore collected under these electrodes during the integration period.

Resuming the explanation, during integration the field effect transistors 62, 63 and so on are turned on either continuously or intermittently by making RR positive. The voltage level GN which, in the mode of operation shown in FIG. 3 is at ground level, is applied through these transistors to the row conductors such as 60, 61 and so on. Placing the octagonally shaped electrodes at ground level during integration is advantageous as the substrate regions beneath these electrodes serve to control blooming (so-called "operational" blooming control). Excess minority carriers which overflow a storage potential well under the common electrodes (at fixed potential $H_2$) can combine with majority carriers present beneath the octagonally shaped electrodes and be dissipated in this way. Such overflowing carriers, caused by an intense light source, would otherwise result in blooming.

Charges may be read from each row of the array by first making RR low to turn off transistors 62, 63 and so on. The row conductors whichs are not being scanned retain the level GN by virtue of the capacitance to the substrate. Alternatively, RR can be left high continuously, provided the transistors 62, 63, etc. are made sufficiently small that they can act as load resistors which do not prevent the row buses 60, 61 from following the horizontal clock potentials when they are being produced.

To scan row 1, $V_1$ is made high while the remaining vertical clock voltages $V_2 \ldots V_N$ remain low. When $V_1$ goes high, transmission gate transistors 70 and 72 turn on. Assuming this to be the odd field, the clock voltages $H_1$ and $H'_1$ are complementary as shown in FIG. 7. The horizontal clock voltage $H_1$ passes through transistor 70 and appears as the alternating line voltage $G_1$. The horizontal clock voltage $H'_1$ passes through transistor 72 and appears as the alternating clock voltage $G_2$. Assume that $G_2$ goes high to start with as shown in FIG. 7, and the $G_1$ goes low when $G_2$ goes high. When, during this first half period, $G_2$ goes high, the charges are propagated one half stage to the right as shown in FIG. 3 at b. One half period of $G_2$ later, $G_1$ goes high and the charges in row 1 are propagated one half stage to the right similarly to what is shown at b in FIG. 3. Assume that initially charge packets are located in potential well 2 in row 1 and in potential well 2a in row 2. These two charge packets are laterally offset and this is desirable in a charge transfer array to improve resolution. Each row of integrated charge packets is laterally offset relative to the adjacent row of integrated charge packets by an amount equal to approximately half the distance between two charge packets in a row. As $G_2$ cycles between high and low values, the charge in row 2 propagates from potential well 2a to potential well 3a to potential well 4a. Potential well 4a is beneath a lower level two-phase electrode 80 in the output register 64 as is shown most clearly in FIG. 5 and charge propagates to this well via the transfer region transfer electrode 94, shown in FIG. 4. When during a following time period, $\phi_2$ goes high and $\phi_1$ goes low, the charge packet in potential well 4 propagates via the transfer region beneath electrode 82 to the storage well 5 in the output register beneath the $\phi_2$ storage electrode 84.

As the charge above is being propagated in row 2 by the clock voltage $G_2$, the charge packets in row 1 are being concurrently propagated by clock voltage $G_1$. The clock voltage $G_1$ is 180° out of phase with the clock voltage $G_2$ during the odd field so that the charge propagation in row 1 follows that in row 2 by a half period of $G_2$. Thus, for example, upon the completion of integration, charge is stored in potential well 2 of row 1. When $G_2$ goes high, charge from potential well 2a of row 2 propagates to potential well 3a of row 2. A half period of $G_2$ after the charge in potential well 2a of row 2 has shifted into potential well 3a of row 2, the charge in potential well 2 of row 1 shifts into potential well 3 of row 1. After the charge in potential well 3a of row 2 propagates to potential well 4a of row 2, it is shifted by the multiple phase voltages $\phi_1$ and $\phi_2$ of the output register to potential well 5 beneath electrode 84. Note that the multiple phase voltages are at twice the frequency of the $G_1$ and $G_2$ voltages. Therefore, during the half period of $G_2$, when charge propagates to the output register 64, it advances from a half stage of the register to the following half stage of the register as shown by the dotted arrows in FIG. 7.

A half period of $G_2$ after a charge packet in row 2 (say the one originating in well 2a) has been shifted to the output register, a charge packet in row 1 (the one originating in well 2) shifts from potential well 3 to potential wall 4. At the time charge propagates into potential well 4, $\phi_1$ is high and $\phi_2$ is low. thus, when the charge packet in row 1 arrives beneath electrode 80 of the output register, the charge packet from row 2 which was beneath electrode 84 in potential well 5, propagates to the next $\phi_1$ storage electrode (not shown), in the charge propagation direction (see arrow 85), in output register 64. Thus, at this point in time, a charge pocket from row 1 is in potential well 4a beneath the phase 1 storage electrode 80 of one stage and the charge from row 2 which was in potential well 5 beneath storage electrode 85, has propagated to the $\phi_1$ storage electrode (not shown) of the next stage of the output register. In other words, the charges from corresponding locations in the two rows propagate in sequential positions in the output register with a particular charge packet from row 2 located in one stage at one particular instant of time and a corresponding charge packet from row 1 located in the following stage at the same instant in time. Thus, the sequence of charge packets in the output register is the same as the sequence of storage elements along the combined rows from which the packets originated when observed along a line from the right to the left side of the array.

The concurrent readout of rows 1 and 2 continues until both rows are read into the output register 64. These two rows 1 and 2 are for display as the first line on a television screen. The information is high resolution information in the sense that the charges from row 2 are discrete charge packets and the charges from row 1 also are discrete charge packets which are interleaved with those of row 2. When displayed in line 1 of the television screen, there will appear at consecutive locations along line 1, the charges of rows 1 and 2 interleaved with one another in proper sequence.

The readout of the imager continues in the following fashion. After $V_1$ goes high to obtain the concurrent readout of rows 1 and 2, $V_1$ goes low and then $V_3$ goes high to obtain the concurrently readout of rows 3 and 4. Rows 3 and 4 become line 3 of the television display. After $V_3$ goes low, $V_5$ goes high to obtain the concurrent readout of rows 5 and 6. These two rows become line 5 of the odd field and so on.

After the readout of the complete odd field of the television display, the even field is read out. To obtain readout of the even field in proper sequence, $H_1$ is made equal to $H'_1$. In other words, $H_1$ and $H'_1$ are in phase. $\phi_1$ and $\phi_2$ continue to be 180° out of phase and at twice the frequency of $H_1$ and $H'_1$. $G_2$ and $G_3$ and the other G voltages are derived from the in-phase horizontal clock voltages $H_1$ and $H'_1$ so that the G voltages also are in phase with one another.

In the operation of the imager, to obtain the even field, the vertical clock voltages are phased so that during the successive line scan periods the vertical scan generator produces the voltage $V_2$ followed by $V_4$ followed by $V_6$ and so on. That is, during line 2, $V_2$ goes high while all other vertical scan voltages are low, then during line 4 $V_2$ goes low and $V_4$ goes high and so on. When $V_2$ goes high, transistors 90 and 92 of transmission gates 55 and 56, respectively, are turned on and the voltages $G_2$ and $G_3$ are applied to rows 2 and 3, respectively. When $G_2$ and $G_3$ go high upon the termination of the integration time, charge in potential well 2a of row 2 shifts into potential well 3a and concurrently charge in potential well 2b in row 3 shifts into potential well 3b. During the following half period of $G_2$ and $G_3$, $\phi_1$ goes high shifting the charge in row 2 from potential well 3a via the transfer region beneath transfer electrode 94 to the potential well 4a beneath the storage electrode 80. Concurrently, charge from potential well 3b in row 3 shifts via the transfer region beneath transfer electrode 96 to the storage potential well 4b beneath the $\phi_1$ storage electrode 98. Thus, there is present in the storage potential well 4a beneath $\phi_1$ electrode 80 of the output register charge originating at one location of row 2 and there is present in the storage potential well 4b beneath the $\phi_1$ electrode 98 of the following stage charge which originated in the corresponding location in row 3.

The process described above continues until the entire contents of rows 2 and 3 are transferred to the output register 24. These charge packets are employed for line 2 of the even field of television. As in the case of the odd field, line 2 will contain high resolution information and will consist of packets of charge from row 3 interleaved with packets of charge from row 2 which are transferred through the output register in the same sequence in which they originated as observed from right to left along the line. After the readout of rows 2 and 3, rows 4 and 5 are concurrently read out in the same way. These two rows become line 4 of the even field. This process continues until the entire even field has been read out.

The operation just discussed is illustrated, in part, by the waveforms of FIG. 7. These waveforms show at the left, how the first line (line 1) of the odd field is produced, and at the right, how the first line (line 2) of the even field is produced. The figure also shows pictorially how some additional lines of the respective fields are produced. Only a small number of the $H_1$ and $H'_1$ pulses produced per line of information is illustrated to simplify the drawing and in corresponding fashion, the other pulses $G_1$–$G_3$, $\phi_1$ and $\phi_2$ are shown in smaller numbers than that which are actually employed.

It may be observed from the detailed explanation above that in order to obtain the proper sequence of charge packets in the output register, the charge packets are read into the output register in somewhat different fashion in the odd and the even fields. In the odd field, the two rows of a pair are transferred in interleaved fashion into the same potential well (one beneath a $\phi_1$ electrode) of a single stage. Thus, using a pair of rows 1 and 2 as an example, first a charge packet from row 2 arrives in potential well 4a beneath electrode 80 and then (a half period of $G_2$ later) a charge packet from row 1 transfers to the potential well (which is the same well as 4a) beneath the same $\phi_1$ electrode 80. As these two packets of charge arrive at different times and as $\phi_1$ and $\phi_2$ are at double the frequency of $G_1$ and $G_2$, these charge packets are separated from one another in the output register by action of $\phi_1$ and $\phi_2$ so that they propagate in successive stages in the proper order.

In the even field, the operation is somewhat different. Here, a pair of charge packets read from a pair of rows, respectively, are transferred simultaneously into two different potential wells, one beneath one $\phi_1$ electrode and the other beneath a neighboring $\phi_1$ electrode. In the example of rows 2 and 3 which together constitute line 2 of the even field, a charge packet from row 2 transfers to potential well 4a beneath $\phi_1$ electrode 80 while simultaneously a corresponding charge packet from row 3 transfers to potential well 4b beneath a following $\phi_1$ electrode 98. Thus, each packet from row 3 arrives at the output end of the register just after the corresponding packet from row 2 as would be expected from the fact that the row 3 elements are each displaced to the left of the corresponding elements in row 2.

Figure 8:
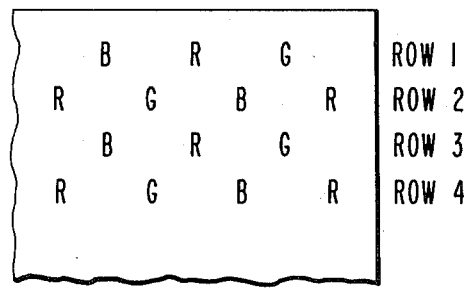
FIG. 8 is a schematic showing of a color imager embodying the invention which illustrates how color filters are arranged over the integrating sites of the imager of FIG. 4.

The system which has just been described may be employed for sensing color information in the manner illustrated in FIG. 8. The designations R, G and B refer to filters for the colors red, green and blue. These are intended by way of example only as such filters can be replaced, for example, by the complementary filters for cyan, magenta and yellow, respectively, or by filters for other combinations of colors. A particular filter will be located over each integration site. For example, a red filter may be located over potential wells 1 and 2. The green filter would be located over the two wells of the next integration site of the same row and so on. Thus, during the integration time, the charges integrated in a particular potential well, such as well 2, are produced in response to light passing predominantly through one color filter; charges integrated at the next adjacent site in the same row are produced in response to light passing predominantly through a color filter of a second color, and so on.

The color filters are in a regular pattern and the arrangement is such that the color information in the odd field is compatible with that of the even field. Thus, referring to FIG. 8, for an odd field, the first or rightmost picture element in row 2 contains red color information. The next charge packet read out is the rightmost one in row 1 and it contains green information. The next charge packet read out is the second packet in row 2, that is, the second from the right, having blue color information, and so on. Thus, the combined color information read from rows 1 and 2 appears in the sequence, RGB, RGB and so on. In the even field, the color information also appears in the same sequence. First, the right-most charge packet (R) in row 2 and the right-most charge packet (G) in row 3 are shifted concurrently into the output register. Then the second packet in row 2, that is, the second from the right charge packet (B) in row 2, is shifted concurrently with the second packet (R) in row 3 into the output register after the first packets entering the register have advanced. Thus, the charges in the output register are in the order of: first the right-most charge in row 2; then the right-most charge in row 3; then the second-from-right charge in row 2; and so on. The color sequence for this line (line 2) of the even field is RGB, RGB and so on which is the same as that of line 1 of the odd field and this is also so for the remaining lines of each field.

The system as described above may be operated using commercial television standards. When operated in this way, the frame rate may be 30 Hz and the field rate 60 Hz. However, in the present system, each row (except for the first and last rows) of the imager is scanned once each field, that is, at a 60 Hz rather than a 30 Hz rate so that flicker is reduced. Further, the interleaved scanning of a pair of rows and the staggering of the pixels in the adjacent rows increases the horizontal resolution of the imager in each field effectively by a factor of 2 over the horizontal resolution which would be obtained in the same imager if each row were scanned separately. The improvement in horizontal resolution and the reduction of flicker and smear due to image motion more than compensates for the moderate reduction in vertical resolution resulting from the scanning of rows in overlapped pairs.

In the system illustrated in FIG. 4 which employs an output CCD register 64, each TV line is progressively delayed relative to the preceding TV line by two periods of the $\phi_1$, $\phi_2$ clock frequency. The reason is that each successive pair of rows is introduced into the output register upstream of the preceding row. There are a number of possible ways for compensating for these delays. The simplest is to progressively advance the phase of the vertical clock for successive lines by two periods of the $\phi_1$, $\phi_2$ clock thereby compensating for the increasing delay in the output register. This system provides a fully-corrected output signal directly to the output register of the sensor. An alternative system would be to apply no timing correction to the vertical clock, but to adjust the time axis of the final signal by an external signal processor. This might consist of a CCD register with multiple taps for obtaining outputs (or inputs) at different positions along the register. In this form of system, electronic switching means are employed for connecting to a different tap for each succeeding line of the field, each tap producing an output which is delayed by the same amount relative to the point of introduction of the line of information to the output register 64. Put another way, the taps would be spaced along the delay line at two-stage intervals to compensate for the two-period delay introduced to the successive lines of each field. Of course, after the first (odd) field is read in a system of this kind, the second (even) field would be read with line 2 of the second (even) field taken from the same tap as line 1 of the first (odd) field.

While for purpose of illustration, the output structure shown in FIG. 4 is a CCD register, other alternatives are possible. One is to employ a separate floating diffusion near the end of each row of the array, each diffusion for sensing the charge propagated thereto and each diffusion for driving its own source follower MOS amplifier. Each diffusion can be connected to the gate electrode of its amplifier and the various amplifiers may be connected to a common output bus. A system of this kind requires no correction for variable delay; however, care must be taken to avoid large variations in threshold potential from one output transistor to the next. In a system of this kind, the same clock gating circuit can be used as is shown in FIG. 4; however, the horizontal clock voltages $H_1$ and $H'_1$ should be 180° out of phase in both the even and the odd fields so that the signals from two rows concurrently being scanned will activate their transistors on alternate half cycles of the horizontal clocks. In this form of system, capacitive coupling between each row bus (such as 60, 62 and so on) and the gate electrode of the output transistor for that row would provide a turn off voltage for each row at all times except when that row was being scanned.

In the mode of operation discussed above, during the integration time charges integrate in potential wells beneath the common first level storage electrode, that is, the apertured electrode operated at the DC level $H_2$ shown in FIG. 5. However, other modes of operation are possible. In one, the voltage level GN applied during the integration time is at a level approximately equal to $H_2$. Operated in this way, potential wells are present both beneath the lower level apertured electrodes and also beneath lower level octagonally shaped electrodes. Referring to FIG. 3, integration would occur beneath electrodes 30-2, 26 and 32-2. When operated in this way, charges have to be combined before shifting them out of the array. Thus, charge in potential well 1 could be combined with charge in potential well 2 and then this combined charge shifted out of the array. A disadvantage of operating in this mode is that operational blooming control, as described above, is not employed. However, diffused blooming buses (not shown) with a barrier gate extending beyond both edges of each bus can be inserted in place of channel stops to suppress blooming in a manner known in the art for use with frame transfer CCD imagers.

Figure 9:
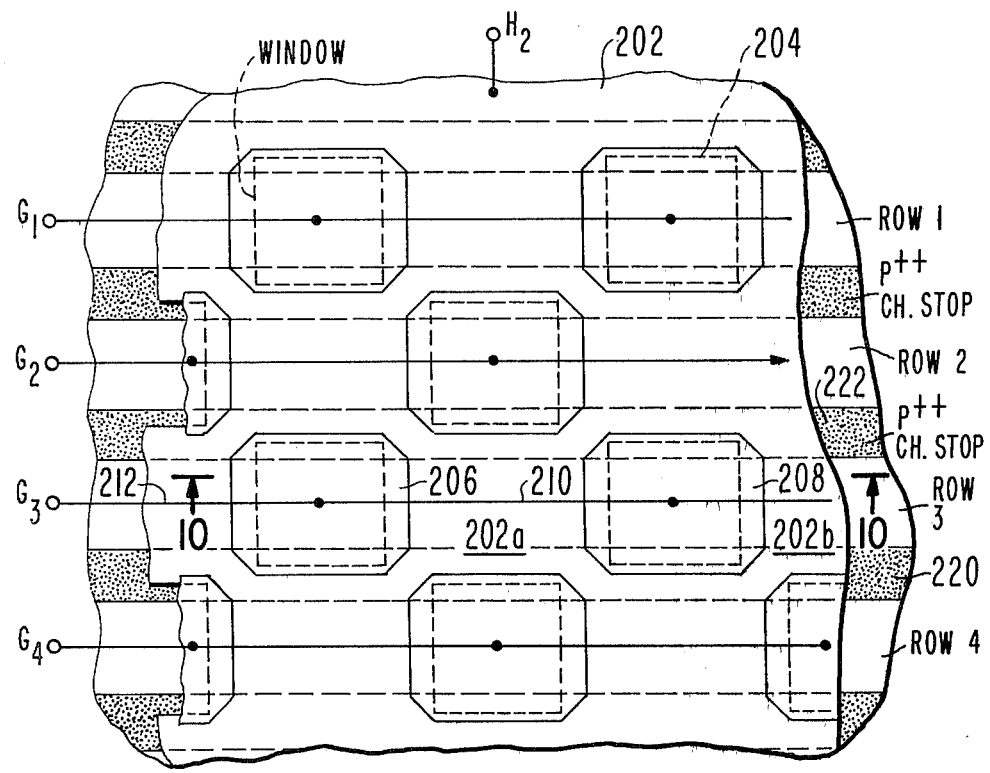
FIG. 9 is a plan view of a second form of imaging system embodying the invention.
Figure 10:
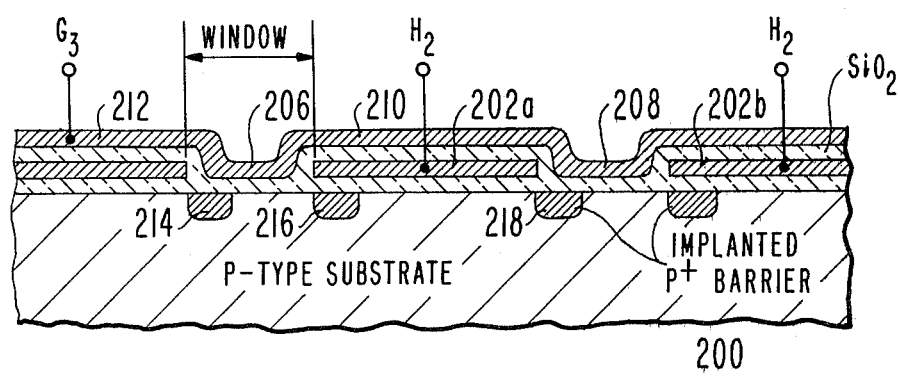
FIG. 10 is a section taken along line 10—10 of FIG. 9.

In the embodiments of the invention discussed so far, there are four electrodes per stage. There are two common electrodes, that is, electrodes driven by $H_2$, one at a first level and the other at a second level, and two octagonally shaped gated electrodes, one at a first level and another at a second level. Four typical such electrodes are shown in FIG. 3 at 26, 28, 30-2 and 30-1. An alternative form of structure is shown in FIGS. 9 and 10. It employs only two electrodes per stage with the required potential well asymmetry obtained by using ion implants in the substrate at the effective leading edge portion (left edge in the figure) of the underlying electrodes. Such an implant produces a barrier at the input edge of each electrode which prevents the charge from spilling back into the preceding stage.

Referring to FIGS. 9 and 10, the CCD comprises a P-type substrate 200 and a common gate electrode 202 which is insulated from the substrate. The common electrode is formed with square windows or apertures 204 therein arranged in columns and rows. The apertures in one row, such as row 1, are displaced in the column direction relative to the apertures in the adjacent row which is row 2 in this example. Thus, the apertures in row 2 are midway between the apertures in row 1. The common electrode 202 is at a first level.

The CCD of FIGS. 9 and 10 also includes a plurality of octagonally shaped electrodes such as 206 and 208, in a second level. Each such electrode is larger than the window over which it is located and overlaps the edges of the window. FIG. 9 illustrates the connection between electrodes in a row schematically by a single line and FIG. 10 shows the connection more realistically as a strap which is in the same level as the octagonally shaped electrodes. One such connection is illustrated at 210 and another at 212.

The required asymmetry in the potential wells is produced by the P+ implanted barrier regions in the substrate such as 214, 216, 218 and so on, which are aligned with the leading edge portion of each "electrode." (In each stage one electrode comprises a region such as 202a between two windows in the common electrode, and the other electrode comprises an octagonally shaped element such as 206.) These implanted regions are doped more heavily than the P-type substrate, but are not as heavily doped as the channel stop regions 220, 222 and so on. The heavier doping of the channel stops is indicated by the designation P++.

Figure 15:
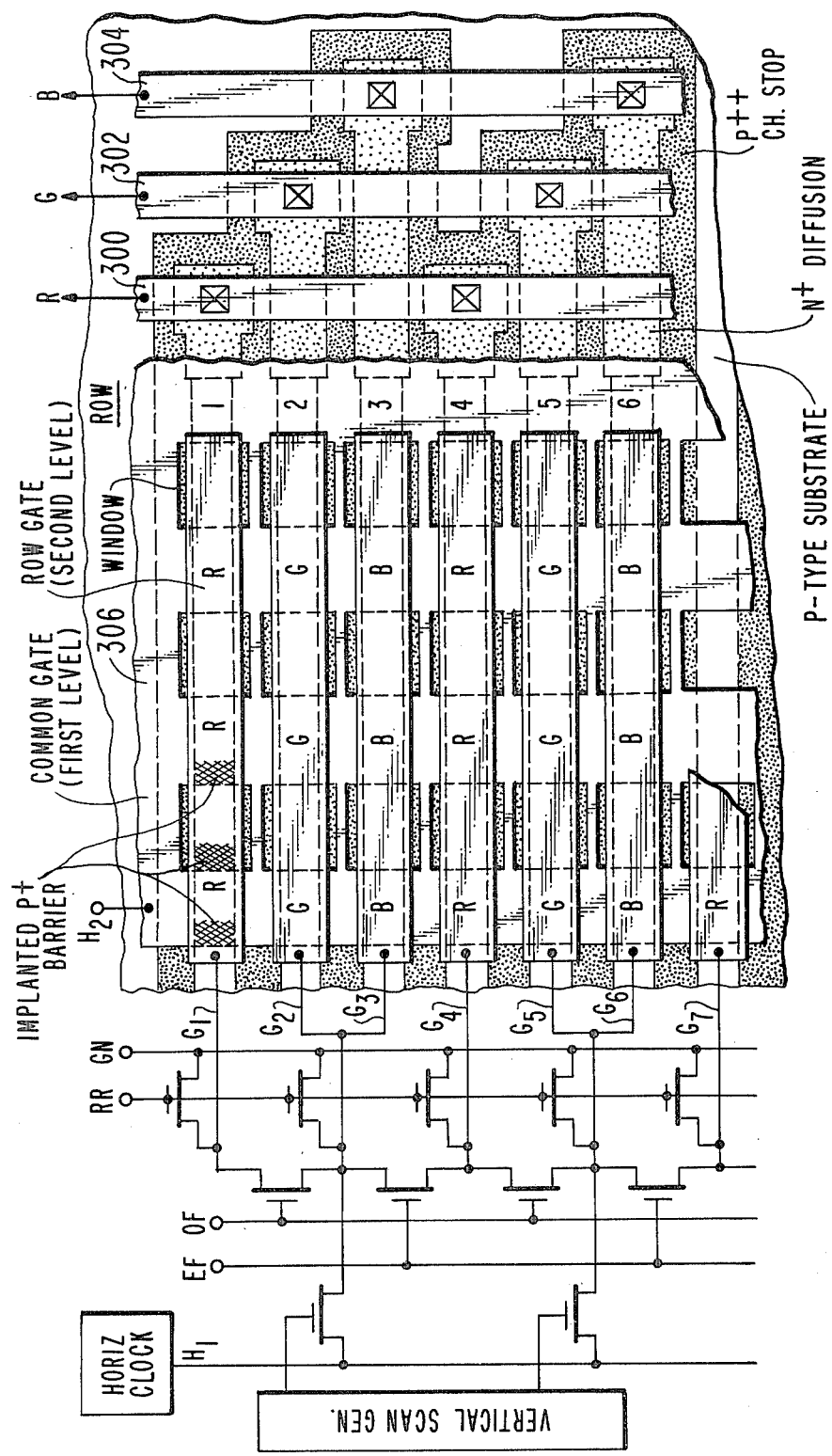
FIG. 15 is a plan view of yet another form of imaging system embodying the invention.

The operation of the embodiment of FIGS. 9 and 10 is quite analogous to that of the embodiment of FIGS. 2 and 3. $H_2$ is a DC level such as V which may be 5 volts or so. During the integration time, all of the row voltages $G_1$, $G_2$ ... $G_N$ are at ground level so that charges integrate beneath the regions such as 202a, 202b and so on of the common electrode 202. To effect readout of a selected pair of rows, the G voltages applied to these rows is varied between levels of 0 and 2 V just as in the previous embodiment. Also, as in the previous embodiment, for the odd field, the G voltage applied to one row is complementary to the G voltage applied to the other row of the pair (for example, $G_1 = \overline{G_2}$). On the other hand, for the even field, the G voltage applied to one row is in phase with the G voltage applied to the other rows of the pair (for example, $G_2 = G_3$). The output structure (not shown) for the CCD of FIGS. 9 and 10 may be similar to that illustrated in FIG. 4, namely a CCD register, or may be an alternative structure such as discussed in connection with FIG. 4 and such as shown in FIGS. 1 and 15.

In the two embodiments of the invention described, the locations in the array are staggered and this has important advantages, as already discussed. However, the invention is not limited to a staggered arrangement. In certain types of single chip color sensors there are advantages to arranging the elements in a rectangular array, that is, with corresponding locations in all rows of the array aligned in the column direction, and to read out the signals in groups of 1, 2, 3 or more lines at a time to provide an optimum balance of color and luminance information. FIGS. 11 and 12 illustrate one such an arrangement. In this array there are twice as many green elements as either red or blue elements to provide a higher resolution luminance or "mixed-high" signal at the expense of resolution in the color channels. As previously, the filter colors are indicated by the capital letters R, G and B for red, green and blue, respectively. The rectangular pattern permits the extra green elements (which form the principal component of the luminance signal) to be arranged in an optimum luminance pattern not feasible with the staggered element patterns. The clock gating structure used for scanning two rows at a time is illustrated in FIG. 11 and the resulting modification in the output register required for the rectangular array is also shown in FIG. 11. The gated clock voltages can have the same phase for each row in both the even and odd fields, thus simplifying the peripheral clock gating circuits.

The operation of the system of FIGS. 11 and 12 should be apparent from the preceding discussion. During the scanning of the odd field, the voltage OF (odd field) goes high and turns on the transistors whose gate electrode receives this voltage. This permits first the pair of rows 1 and 2 to be scanned in parallel, then 3 and 4, then 5 and 6 and so on, in response to the selection of these respective pairs of rows by the vertical scan generator. During the scanning of the even field, the EF (even field) voltage causes the same horizontal clock pulses $H_1$ to be applied first to the pair of rows 2, 3 then to the pair 4, 5 and so on, again in response to the appropriate voltages produced by the vertical scan generator. When a pair of rows is activated and being scanned by a horizontal clock voltage derived from $H_1$, the charge packets in that pair of rows advance toward the output register in synchronism and arrive simultaneously in the A wells, such as $A_1$ and $A_2$, when the pair of rows 1 and 2 is being read out. As before, the output register is driven by the two phase voltages $\phi_1$ and $\phi_2$ which are at twice the frequency of the horizontal clock $H_1$.

The transfer of charge from any pair of rows into the output register with signals interleaved in such fashion that each element of the upper row is read just before the element immediately below it in the lower row, is accomplished as follows. Consider the first two rows during the half cycle of the horizontal clock when $H_1$ is low. The two charge packets which are leaving the wells $A_1$ and $A_2$, respectively, during this period, must be transferred through the storage regions $S_1$ and $S_2$, respectively, into two successive stages of the output register within this half cycle of $H_1$. This transfer is accomplished in proper sequence if $\phi_1$ is high (and $\phi_2$ is low) during the first half of the period and then $\phi_2$ is high (and $\phi_1$ is low) during the second half of the period. While $\phi_1$ is high during the first half of this period, the row 1 charge in well $A_1$ transfers via substrate regions $S_1$ and $B_1$ to the $R_1$ well in the output register. At the same time the row 2 charge in well $A_2$ transfers to the $S_2$ well and is retained there since $\phi_2$ is low (so that a barrier is present at $B_2$). When $\phi_2$ goes high and $\phi_1$ is low, during the last part of this period, the row 2 charge transfers from $S_2$ to $R_2$ via $B_2$ and the row 1 charge moves up the output register (in the direction indicated by arrow 250) from $R_1$ to $R_0$. The output register now contains charges from rows 1 and 2 in proper sequence. During the next half cycle of $H_1$ (while $H_1$ is high), these charges each advance two half stages in the output register (for example, from $R_2$ to $R_0$) and the process is ready to be repeated for the next pair of charges.

Although differing in details of layout and in peripheral circuits, the rectangular array of FIGS. 11 and 12 utilizes double-row scanning for the same purposes as the previous examples, that is, to increase the number of distinguishable elements which can be read out in a one line time and to obtain interlace. The same technique can be extended to the simultaneous readout of three or more rows at a time as discussed later.

Figure 13:
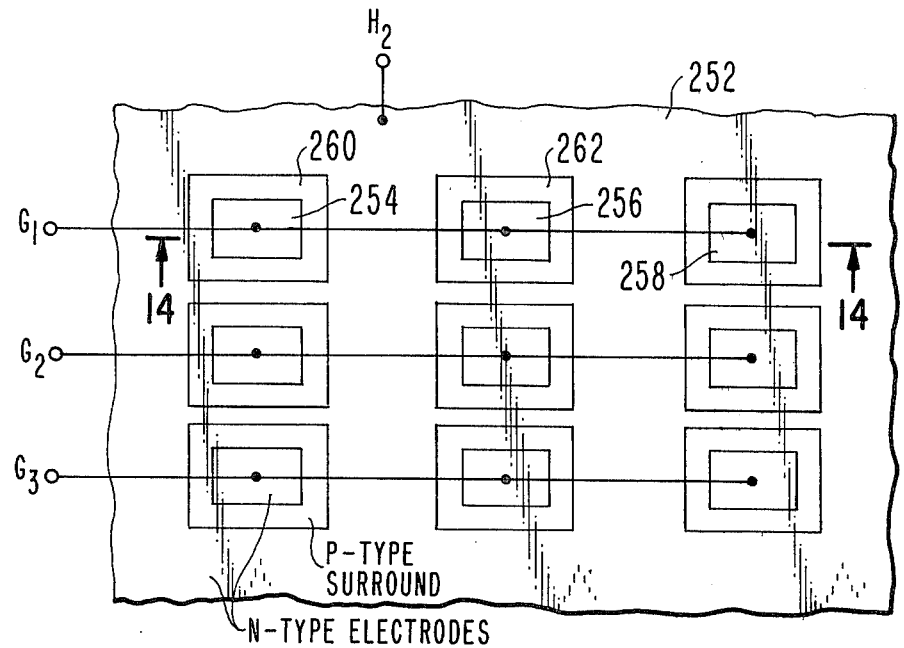
FIG. 13 is a plan view of a portion of another imaging system embodying the invention.
Figure 14:
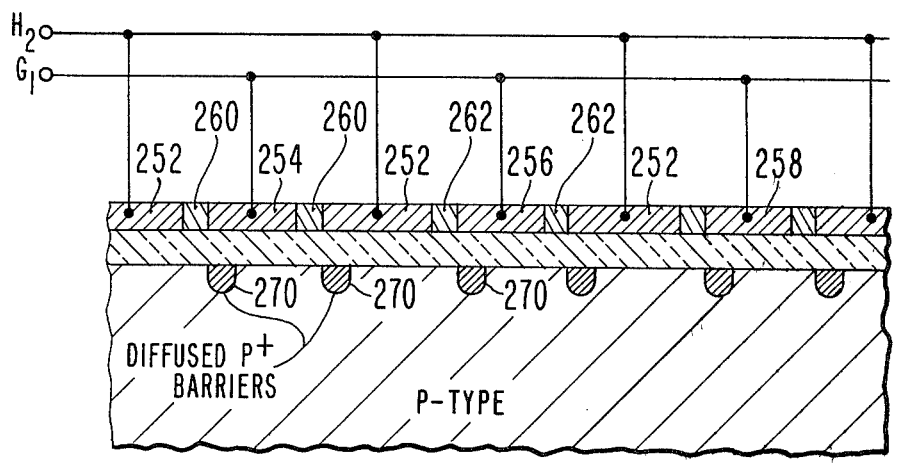
FIG. 14 is a section taken along line 14—14 of FIG. 13.

FIGS. 13 and 14 illustrate a rectangular array which may be of the same general type as shown in FIGS. 11 and 12; however, a single level electrode structure is employed rather than the two level structure of FIGS. 11 and 12. The common electrode 252 may be formed of N type polysilicon and the row electrodes such as 254, 256 and so on, may also be formed in the same level of the N-type polysilicon. The P-type regions in the polysilicon layer shown at 260, 262, etc., serve to isolate the N-type row gates such as 254, 256 and so on, from the N-type common gates 252. (U.S. Pat. No. 3,943,545 issued to Kim, directed to a different electrode structure—namely parallel electrodes—is of interest in showing a single layer structure where the electrodes are polysilicon of one conductivity type and the intervening regions are polysilicon of opposite conductivity type.) The P-type regions should allow sufficient conductivity between the gates to prevent charging effects in the polysilicon from forming undesired barriers between adjacent wells in the CCD registers. The row lines employed for driving the isolated N-type row gates such as 254, 256 and so on, are shown schematically in FIG. 12. In practice, such lines may be formed of overlying metallic strips both here and in the other embodiments.

The desired asymmetry in the potential wells formed in response to the voltages applied to the common and row electrodes is provided by the barrier regions 270 which are aligned with the respective input edges of the electrodes, as illustrated. These barrier regions are P type and have an impurity concentration somewhat higher than the P type substrate and considerably lower than the impurity concentration employed for the channel stops (not illustrated).

The operation of the imager of FIGS. 13 and 14 is analogous to that of the one of FIGS. 11 and 12.

In the embodiments of the invention previously illustrated, the imager is read out two rows at a time. FIG. 15 shows a line transfer color imager in which three rows are transferred out at the same time to provide three simultaneous color signals for each line. A horizontal striped color filter comprising three colors (red, green and blue are illustrated; however, these are examples only) is aligned with the rows to produce different color filters for adjacent rows. The modulated output signals reaching the end of the horizontal registers are collected at N+ floating diffusions which are connected in three groups corresponding to the three color signals. The three output buses 300, 302 and 304 are connected to output amplifiers (not shown) which should have a relatively low input impedance in order to avoid possible mixing of color signals due to capacitive coupling between adjacent buses. Alternatively, the output structure shown could be replaced by a single CCD output register operating at three times the frequency of the horizontal clock signal $H_1$ in a manner analogous to the double row systems already described.

The structure of the image sensor of FIG. 15 is similar to that of previous embodiments in that it includes a common first level electrode formed with a plurality of windows therein. The windows are arranged in a rectangular array similar to the windows of FIG. 11. The row gate electrodes are in a second level and pass over the windows. The imager would appear in cross-section similar to what is shown in FIG. 12; however, the cross-section of the imager of FIG. 15 is not illustrated. There are implanted barrier regions present at each location of the imager, these barrier regions being more heavily doped than the P type substrate, but less heavily doped than the P++ channel stop regions. Only two such implanted regions are illustrated, these being shown at the upper left of FIG. 15. However, it is to be understood that similar regions are present at all locations of the imager.

A circuit for coupling three adjacent row buses to the horizontal clock source is shown at the left side of FIG. 15. As in previous embodiments, the row buses are held at a reference potential such as ground at all times except during the scanning period when the row bus is driven above and below the potential $H_2$ of the common gate electrode 306. Vertical interlace is achieved by driving different groups of rows in successive fields; however, in the present embodiment each such group consists of three adjacent rows rather than two. In the example shown, the odd field (OF) lines on the display are formed from rows 1,2,3; 4,5,6; and so on while the even field lines of the display are formed from rows 2,3,4; 5,6,7; and so on. With minor modification of the arrangement of input selection transistors, the even field can be formed from rows 3,4,5; 6,7,8; and so on with the odd field formed from rows 1,2,3; 3,4,5; and so on. For example, this can be done by pairing row 1 with row 2, that is, connecting $G_1$ to $G_2$ and disconnecting $G_2$ from $G_3$, and making similar modifications for the remaining groups of three rows each. A 480-line interlaced raster (240 lines per field) for the imager of FIG. 15 would require 720 horizontal rows in the imager and a stripped filter containing 720 stripes.

The imager of FIG. 15 is one in which each group of three rows is concurrently driven by three in-phase voltages and in which three charge packets at a time, representing the three different color components red (R), green (G) and blue (B), respectively, are transferred from the three rows. The red component passes to bus 300, the green component arrives concurrently at bus 302 and the blue color component arrives at the same time at bus 304. Each group of three such signals may be processed to produce the color signal for a location on the screen of a color kinescope.

While the imager of FIG. 15 is illustrated to have a particular type of electrode structure, it is clear that the principles are applicable to other types of structures such as, for example, is illustrated in FIG. 14. Further, while in FIG. 15 and in the other figures, single phase clocking is employed in the sense that $H_2$ remains at a fixed level and the row voltages $G_1$, $G_2$ and so on, vary between levels greater than and lower than $H_2$ during scanning, multiple-phase clocking two, three or higher phase may be used instead.

While for purpose of illustration, specific structures have been discussed, it is to be understood that these are intended as examples only. To give some illustrations, while the CCD shown is a P substrate (N channel) surface channel device, it is to be understood that the invention is equally operative using an N-type substrate (P channel). Further, the system can employ a buried channel CCD rather than a surface channel CCD. Further, while polysilicon electrodes are illustrated, one could employ instead, transparent metal oxide electrodes for a front-surface illuminated imager or opaque metal or other forms of electrodes for a back-surface illuminated device. Other modifications within the skill of the art also are possible and within the scope of the present invention.

What is claimed is:

1. In combination:

a charge transfer imager of the line transfer type comprising an array of charge transfer locations arranged in a plurality n of rows numbered 1, 2, 3 ... n;

means for applying clock voltages to the array for reading out substantially one field of the array comprising means for concurrently applying clock voltages to a first pair j and j+1 of adjacent rows of the array for serially reading out the locations in these rows in interleaved fashion, and for repeating this process for each succeeding pair j and j+1 of adjacent rows, one pair at a time, until substantially one complete field has been read out of the array, where j is an odd integer having the consecutive odd values 1, 3, 5 and so on, respectively, for succeeding pairs of adjacent rows in the array; and means for applying clock voltages to the array for reading out a second field of the array comprising means for concurrently applying clock voltages to a pair j+1 and j+2 of adjacent rows of the array for serially reading out the locations in these rows in interleaved fashion, and for repeating this process for each succeeding pair j+1, j+2 of adjacent rows of the array until the second complete field of the array has been read out, where (j+1) has the successive even values 2, 4, 6 and so on, for succeeding pairs of adjacent rows in the array.

2. In the combination as set forth in claim 1, said charge transfer imager comprising a charge-coupled device (CCD) imager.

3. In the combination as set forth in claim 2, each row of said array comprising a plurality of stages, and each stage comprising a substrate, one electrode means receptive of a direct voltage level V for producing a first asymmetrical potential well in the substrate, and second electrode means receptive of an alternating voltage which changes from a first level $V_1 > V$ to a second level $V_2 < V$ for creating an asymmetrical potential well in the substrate which, in response to $V_2$, can propagate charge to a succeeding first potential well and in response to $V_1$, can receive charge from a preceding first potential well.

4. In the combination as set forth in claim 1, further including, at the end of each row, means receptive of charge propagated thereto; and further including output means for receiving such charge from the respective pairs of rows in interleaved fashion.

5. In the combination as set forth in claim 1, each row of the array comprising a plurality of stages, the stages in each row being offset, in the row direction, with respect to stages in the adjacent row or rows, an amount less than the length in the row direction, of a stage.

6. In the combination as set forth in claim 5, one of the surfaces of the array comprising an image receiving surface, and further including over this surface, an array of color filters, each filter of the array covering at least one stage in a row.

7. In the combination as set forth in claim 6, said array of color filters being arranged in a pattern such that the color information read out in one field repeats in the same sequence as that read out during the other field.

8. A charge-coupled device (CCD) array comprising:
a semiconductor substrate;
potential barrier regions in the substrate extending in the row direction, each pair of adjacent such barrier regions defining between them a channel for the propagation of charge;
first and second common electrodes, at first and second levels, respectively, separated from one another and the substrate by insulation, each such electrode comprising conductive means formed with apertures of the same size therein, the apertures being arranged in rows, each row of apertures being located over a different channel, each row being offset in the row direction relative to the adjacent rows by an amount equal to approximately one half of the center-to-center spacing of apertures in a row, the first level electrode being displaced in the row direction relative to the second level electrode by an amount equal to a fraction of the dimension in the row direction of an aperture;
a plurality of pairs of electrodes, each pair comprising a first level third electrode of smaller size than an aperture located within an aperture of said first common electrode, and a second level fourth electrode of smaller size than an aperture, located within an aperture in said second common electrode, these third and fourth electrodes being separated from each other and from the common electrodes by insulation, said fourth electrode overlapping at one edge its paired third electrode and at its opposite edge said first electrode, and each second electrode having a first edge defining an edge of an aperture in a row which overlaps a third electrode and a second edge defining an edge of an adjacent aperture in the same row which overlaps a first electrode.

9. A CCD array as set forth in claim 8, further including:
means coupled to said first and second electrodes for applying a direct voltage at a level V thereto; and
clock voltage means for selectively applying to each row of third and fourth electrodes, an alternating voltage which varies in value between levels $V_1 > V$ and $V_2 < V$.

10. A CCD array as set forth in claim 9, further including:
means for selecting an adjacent pair of rows at a time for concurrently receiving said alternating voltages produced by said clock voltage means, for effecting concurrent readout of said pair of adjacent rows; and
output means for receiving charge signals concurrently read from each pair of adjacent rows.

11. A CCD array as set forth in claim 10, wherein alternating voltages are applied in opposite phase to the two respective rows of each pair rows.

12. A CCD array as set forth in claim 10, wherein a frame of information is read from the array in the form of two interlaced fields, said means for selecting comprising, for one field, means for selecting successive pairs $j$ and $j+1$ of rows of readout, and for the other field, means for selecting successive pairs $j+1$ and $j+2$ of rows for readout, where the rows are numbered 1, 2, 3 ... n, n being an integer substantially greater than 3, where j is an odd integer having the values 1, 3, 5 and so on for successive pairs of rows of said one field, and $j+1$ is an even integer having the values 2, 4, 6 and so on for successive pairs of rows of said other field.

13. A CCD array as set forth in claim 12, wherein said alternating voltages are applied in opposite phase to the two rows of each pair during said one field and in the same phase to the two rows of each pair during said other field.

14. A charge-coupled device (CCD) array comprising:
a semiconductor substrate;
potential barrier regions in the substrate extending in the row direction, each pair of adjacent such barrier regions defining between them a channel for the propagation of charge;
a common first electrode separated from the substrate by insulation, said electrode comprising conductive means formed with apertures of the same size therein, the apertures being arranged in rows, each row of apertures being located over a different channel;
a plurality of second electrodes, one per aperture, each such second electrode being insulated from the first electrode and located over the substrate region within an aperture of said first electrode;
potential barrier regions in the substrate, beneath spaced regions of the first electrode in each row adjacent to corresponding edges of the apertures in each row, and beneath corresponding edge portions of each second electrode, whereby in response to voltages applied to said electrodes, asymmetrical potential wells form in the substrate for the storage and propagation of charge.

15. A CCD array as set forth in claim 14, further including:
means for applying a DC level V to said common first electrode; and
means for selectively applying to each row of second electrodes a voltage which, during one period of time, is at a DC level, and during another period of time varies between two levels, one greater than and the other less than V.

16. A CCD array as set forth in claim 14, wherein each second electrode is larger than one of said apertures and overlaps the edges of an aperture, the overlapping edges of each second electrode being spaced further from the substrate than the edges of the aperture it overlaps.

17. A CCD array as set forth in claim 16, wherein each row of the array comprises a plurality of second electrodes and a plurality of first electrode portions, each first electrode portion comprising a region of the first electrode between two adjacent apertures in the row, the bulk of said substrate being of a given conductivity type, said potential barrier regions comprising substrate regions of the same conductivity type which are doped more heavily than the bulk of the substrate, each first electrode portion including in the substrate region beneath its lagging edge portion such a potential barrier region, and each second electrode including in the substrate region beneath its lagging edge portion such a potential barrier region, where lagging edge is relative to the direction of charge propagation in each row.

18. A CCD array as set forth in claim 14 wherein each row of apertures is offset in the row direction relative to the adjacent rows by an amount equal to approximately one half of the center-to-center spacing of apertures in a row.

19. In combination:
a charge transfer imager of the line transfer type comprising an array of charge transfer locations arranged in a plurality n of rows numbered 1, 2, 3 ... n;
means for applying clock voltages to the array for reading out substantially one field of the array comprising means for concurrently applying clock voltages to a first group j ... (j+m) of m+1 adjacent rows of the array for serially reading out the locations in these rows in interleaved fashion, and for repeating this process for each succeeding group of m+1 adjacent rows, j ... j+m, one group of rows at a time, until substantially one complete field has been read out of the array, where m is an integer equal to at least 1, and where j is an integer having the consecutive values 1, 2+m, 3+2m, 4+3m and so on, respectively, for succeeding groups of m+1 adjacent rows in the array; and
means for applying clock voltages to the array for reading out a second field of the array comprising means for concurrently applying clock voltages to a group (j+k) ... (j+k+m) of m+1 adjacent rows of the array for serially reading out the locations in these rows in interleaved fashion, and for repeating this process for each succeeding group (j+k) ... (j+k+m) of adjacent rows of the array until second complete field of the array has been read out, where k is an integer having a given value selected from the range of values 1 to m−1, and j+k has the successive values 1+k, 2+m+k, 3+2m+k, 4+3m+k, and so on, for successive groups of m+1 adjacent rows in the array.

20. In the combination as set forth in claim 19, said charge transfer imager comprising a charge-coupled device (CCD) imager.

21. In the combination as set forth in claim 20, each row of said array comprising a plurality of stages, and each stage comprising a substrate, one electrode means receptive of a direct voltage level V for producing a first asymmetrical potential well in the substrate, and second electrode means receptive of an alternating voltage which changes from a first level $V_1 > V$ to a second level $V_2 < V$ for creating an asymmetrical potential well in the substrate which, in response to $V_2$, an propagate charge to a succeeding first potential well and in response to $V_1$, can receive charge from a preceding first potential well.

22. In the combination as set forth in claim 19, further including, at the end of each row, means receptive of charge propagated thereto; and further including output means for receiving such charge from the respective groups of m+1 rows in interleaved fashion, that is, with the output means receiving the charge packets in the same relative position in each row, in sequence, from the (m+1 rows) of a group, then repeating the process for the next charge packet in each row, and so on, until all (m+1) rows of the group have been read out.

23. In the combination as set forth in claim 19, each row of the array comprising a plurality of stages, the stages in each row being offset, in the row direction, with respect to stages in the adjacent row or rows, an amount less than the length in the row direction, of a stage.

24. In the combination as set forth in claim 19, each row of the array comprising a plurality of stages, the stages in each row being aligned in the column direction with the corresponding stages in all other rows.

25. In the combination as set forth in claims 23 or 24, one of the surfaces of the array comprising an image receiving surface, and further including over this surface, an array of color filters, each filter of the array covering at least one stage in a row.

26. In the combination as set forth in claim 25, said array of color filters being arranged in a pattern such that the color information read out in one field repeats in the same sequence as that read out during the other field.

27. In a charge-coupled device (CCD) color imager comprising N rows of CCD stages, where N is an integer, an arrangement for achieving vertical interlace in which the color information for each line of one field arrives in the same order as that for each line of the other field, comprising:
color filters for the different colors arranged in the same first particular order in each row of one group of alternate rows of the array;
color filters for the different colors arranged in the same second particular order in each row of the other group of alternate rows of the array, where the second particular order may be different than the first particular order;
means for reading out one field from the array comprising means for reading the charges stored in a first pair j and j+1 of adjacent rows of the array in interleaved fashion by first reading the charge packet, call it the m'th charge packet, at one end of the (j+1)'th row, followed by the charge packet, call it the m'th charge packet, at the same end of the j'th row, followed by the (m−1)'th charge packet in the (j+1)'th row, followed by the (m−1)'th charge packet in the j'th row, and so on until both rows have been read out, and for repeating this process for each succeeding pair j and j+1 of adjacent rows, one pair at a time, until one field has been read out of the array, where j is an odd integer having the consecutive odd values 1, 3, 5 and so on, respectively, for succeeding pairs of adjacent rows in the array; and
means for reading out the other field from the array comprising means for reading out the charges stored in a second pair j+1 and j+2 of adjacent rows of the array in interleaved fashion by first reading the m'th charge packet in the (j+1)'th row, followed by the m'th charge packet in the (j+2)'th row, followed by the (m−1)'th charge packet in the (j+1)'th row, followed by the (m−1)'th charge packet in the (j+2)'th row, and so on until both rows have been read out, and for repeating this process for each succeeding pair j+1 and j+2 of adjacent rows, one pair at a time, until the other field has been read out of the array, where (j+1) is an even integer having the consecutive even values 2, 4, 6 and so on, respectively, for succeeding pairs of adjacent rows in the array.

28. In a charge-coupled device (CCD) color imager comprising N rows of CCD stages, where N is an integer, an arrangement for achieving vertical interlace, comprising:

color filters arranged in the same color pattern over each group of three rows, the color pattern comprising a first color over the first row of each said group, a second color over the second row of each said group, and a third color over the third row of each said group;

means for reading out one field from the array comprising means for reading the charges stored in a first group j, j+1 and j+2 of adjacent rows of the array by concurrently reading the charge packet, call it the m'th charge packet, at one end of the j'th row, the m'th charge packet at the same end of the (j+1)'th row, and the m'th charge packet at the same end of the (j+2)'nd row, followed by concurrently reading the (m−1)'th charge packet in the j'th row, the (m−1)'th charge packet in the (j+1)'th row, and the (m−1)'th charge packet in the (j+2)'nd row, and continuing the readout for the following charge packets in the three rows in similar fashion until all three rows have been read out, and for repeating this process for each succeeding group j, j+1 and j+2 of three adjacent rows, one group at a time, until one field has been read out of the array, where j is an integer having the consecutive values 1, 4, 7 and so on, respectively, for succeeding groups of adjacent rows in the array; and means for reading out the other field from the array comprising means for reading out the charges stored in a second group j+k, j+k+1 and j+k+2 of adjacent rows of the array by concurrently reading the m'th charge packet in the (j+k) row, the m'th charge packet in the (j+k+1) row, and the m'th charge packet in the (j+k+2) row, followed by the concurrent reading of the (m−1)'th charge packet in the (j+k) row, the (m−1)'th charge packet in the (j+k+1) row and the (m−1)'th charge packet in the (j+k+2) row, and continuing the readout for the following charge packets in the three rows in similar fashion until all three rows have been read out, and for repeating this process for each succeeding group j+k, j+k+1 and j+k+2 of three adjacent rows, one group at a time, until the other field has been read out of the array, where k is an integer selected from the values 1 and 2, and (j+k) is an integer having the values 2, 5, 8 and so on, respectively, for succeeding groups of three adjacent rows in the array when k=1, and (j+k) is an integer having the values 3, 6, 9 and so on, respectively, for succeeding groups of three adjacent rows in the array when k=2.

29. In combination:

a charge transfer imager of the line transfer type comprising an array of charge transfer locations arranged in a plurality n of rows numbered 1, 2, 3 ... n;

means for applying clock voltages to the array for reading out substantially one field of the array comprising means for concurrently applying clock voltages to a first group j ... (j+m) of m+1 adjacent rows of the array for serially reading out the locations in these rows and for repeating this process for each succeeding group of m+1 adjacent rows, j ... j+m, one group of rows at a time, until substantially one complete field has been read out of the array, where m is an integer equal to at least 1, and where j is an integer having the consecutive values 1, 2+m, 3+2m, 4+3m and so on, respectively, for succeeding groups of m+1 adjacent rows in the array; and means for applying clock voltages to the array for reading out a second field of the array comprising means for concurrently applying clock voltages to a group (j+k) ... (j+k+m) of m+1 adjacent rows of the array for serially reading out the locations in these rows, and for repeating this process for each succeeding group (j+k) ... (j+k+m) of adjacent rows of the array until the second complete field of the array has been read out, where k is an integer having a given value selected from the range of values 1 to m−1, and j+k has the successive values 1+k, 2+m+k, 3+2m+k, 4+3m+k, and so on, for successive groups of m+1 adjacent rows in the array.

30. In the combination as set forth in claim 29, said means for applying clock voltages to the array during each field for reading out groups of adjacent rows comprising means for concurrently reading out m+1 charge packets at a time, said m+1 charge packets in each case, originating from m+1 corresponding locations in the m+1 rows.

31. In the combination as set forth in claim 30, each row of the array comprising a plurality of stages, the stages in each row being aligned in the column direction with the corresponding stages in all other rows.

32. In the combination as set forth in claim 29, said means for applying clock voltages to the array during each field for reading out groups of adjacent rows comprising means for reading out a single charge packet at a time, with successive charge packets being read from successive rows in each group so as to obtain a serial stream of interleaved charge packets from the m+1 rows of each groups of rows.

* * * * *